United States Patent [19]
Greenberg

[11] Patent Number: 5,742,552
[45] Date of Patent: Apr. 21, 1998

[54] TIMING CONTROL FOR CLOCKED SENSE AMPLIFIERS

[75] Inventor: Craig B. Greenberg, Rowlett, Tex.

[73] Assignee: Texas Instruments Incorporated, Dallas, Tex.

[21] Appl. No.: 740,636

[22] Filed: Oct. 31, 1996

[51] Int. Cl.$^6$ ...................................................... G11C 7/00
[52] U.S. Cl. ........................ 365/210; 365/205; 365/208; 327/57
[58] Field of Search ................................. 365/203, 205, 365/207, 208, 210; 327/53, 57

[56] References Cited

U.S. PATENT DOCUMENTS 4,421,996  12/1983  Chuang et al. .................... 365/205 X
4,816,706  3/1989  Dhong et al. ..................... 365/205 X Primary Examiner—Joseph A. Popek
Attorney, Agent, or Firm—Robby T. Holland; Wade James Brady, III; Richard L. Donaldson

[57] ABSTRACT

A semiconductor memory is disclosed having a primary memory array (12) and a dummy column (14) associated therewith that is comprised of a plurality of dummy memory cells (70). The dummy memory cells have a predetermined value stored therein and are sensed with a dummy sense amplifier (18). The dummy sense amplifier (18) has a predetermined offset disposed therein, such that it is in a predetermined state prior to the bit lines separating a sufficient amount to detect the logic state in the dummy memory cell, with an offset disposed therein. This offset prevents the state of the dummy sense amp from being changed until the bit lines are separated by a predetermined value. The primary sense amplifiers associated with the primary memory array (12) are not enabled until the dummy sense amplifier has detected the dummy bit lines as being separating by the predetermined amount. Once this bit line separation has been detected, the primary sense amplifiers are enabled, and the data stored in the accessed memory of the primary memory array (12) latched into the primary sense amplifiers.

11 Claims, 3 Drawing Sheets

TIMING CONTROL FOR CLOCKED SENSE AMPLIFIERS

TECHNICAL FIELD OF THE INVENTION

The present invention pertains in general to random access memories and, more particularly, to a timing control for a docked sense amplifier associated with the random access memory.

BACKGROUND OF THE INVENTION

Random access memories are typically configured with a plurality of memory cells disposed in an array of rows and columns. Each of the memory cells is operable to store a single bit of information. Access to this information is facilitated by activating all memory cells in a given row and outputting the data associated therewith onto bit lines which are disposed along each of the columns. Once the data is disposed on the bit lines, the bit lines begin to separate to opposite power supply rails, and a sense amp is utilized to latch the information on the bit lines after they separate a predetermined distance. Typically, this sense amp is a differential sense amplifier with each of the memory cells providing both a data signal and a data-bar signal on two complementary bit lines associated with each column. In operation, prior to activating the memory cells, the bit lines are precharged to a common value. Once the memory cell associated therewith is activated, it will pull one of the data lines toward ground and the other data line to a predetermined level. The sense amp disposed between the two complementary bit lines is then operable to sense the difference between the two bit lines, which when it exceeds a predetermined difference, will indicate to the sense amp the differing logic states, and the sense amp will then latch this value therein.

There are two common types of sense amplifiers utilized for memory devices, one being a standard differential sense amplifier and the other being a clocked-latch type sense amplifier. The standard differential sense amplifier is a sense amplifier that utilizes a current mirror configuration that essentially functions as a differential amplifier. However, these type of sense amplifiers have a disadvantage in that they consume DC power even during the time that they are not actually performing a sense operation. The docked-latch type sense amplifier provides several advantages; they dissipate low power and they also work well at low voltages compared to the current mirror sense amplifier. They also utilize less area. However, one disadvantage to the latch-type sense amplifier is that correct sensing requires precise timing with respect to the sense amplifier enabling and the bit line differential being sensed. If there is not adequate bit line differential when the amplifier is enabled, i.e., the bit lines have not separated sufficiently in voltage, incorrect data may be sensed and no recovery is possible. This lack of recovery is due to the latching nature of the sense amplifier. To assure correct latching of the data, prior systems have utilized a series of delays to ensure that the sense amplifier was not enabled prior to a sufficient amount of time having been allowed for the bit lines to separate. Unfortunately, this is an inexact technique due to such things as temperature variations and process variations across the surface of the chip in a given array. Further, as the chip is increased in size and the number of memory cells has increased, this also must be compensated for in the delay.

SUMMARY OF THE INVENTION

The present invention disclosed and claimed herein comprises a random access memory having a primary array of primary memory arranged in rows and columns, with each primary memory cell having true and complement data stored therein. Each of the columns of primary memory cells has associated therewith a pair of precharged true and complement bit lines, wherein access of one of the primary memory cells in a column will cause the voltage level of the corresponding pair of true and complement bit lines to separate in accordance with the true and complement data stored in the accessed one of the primary memory cells. At least one primary sense amplifier is associatable with each of the pairs of bit lines to allow sensing of the voltage level thereon. Once sensed, a data value can then be determined and latched in the primary sense amp when the true and complement bit lines have separated by a predetermined voltage difference. The at least one primary sense amplifier is clocked by an enable signal, such that the sense operation is only initiated when the enable signal is true. A separation detector is then operable to determine the separation between the true and complement bit lines input to the at least one primary sense amplifier. An enable control then generates the enable signal when the detected bit line separation exceeds the predetermined threshold.

In another aspect of the present invention, the separation detector is comprised of a dummy column of dummy memory cells. Each of the dummy memory cells has true and complement data stored therein, with the dummy column having associated therewith a pair of true and complement bit lines. When one of the dummy memory cells is accessed in the dummy column, this will cause the voltage level on the associated true and complement bit lines in the dummy column to separate in accordance with the true and complement data stored in the accessed one of the dummy memory cells. A dummy sense amplifier is then provided for sensing the voltage difference between the true and complement bit lines in the dummy column, and then generating an output signal when the sensed voltage exceeds the predetermined threshold. The enable control is then operable to generate the enable signal in response to the generation of the control signal.

In a further aspect of the present invention, the dummy column is arranged such that the number of dummy cells in a column is equal to the number of primary memory cells in a column in the primary array. The bit lines in the dummy column are sized substantially equal to the bit lines in the primary array. Additionally, each of the dummy memory cells is substantially sized to that of the primary memory cells.

BRIEF DESCRIPTION OF THE DRAWINGS

For a more complete understanding of the present, invention and the advantages thereof, reference is now made to the following description taken in conjunction with the accompanying Drawings in which.

DETAILED DESCRIPTION OF THE INVENTION

Figure 1:
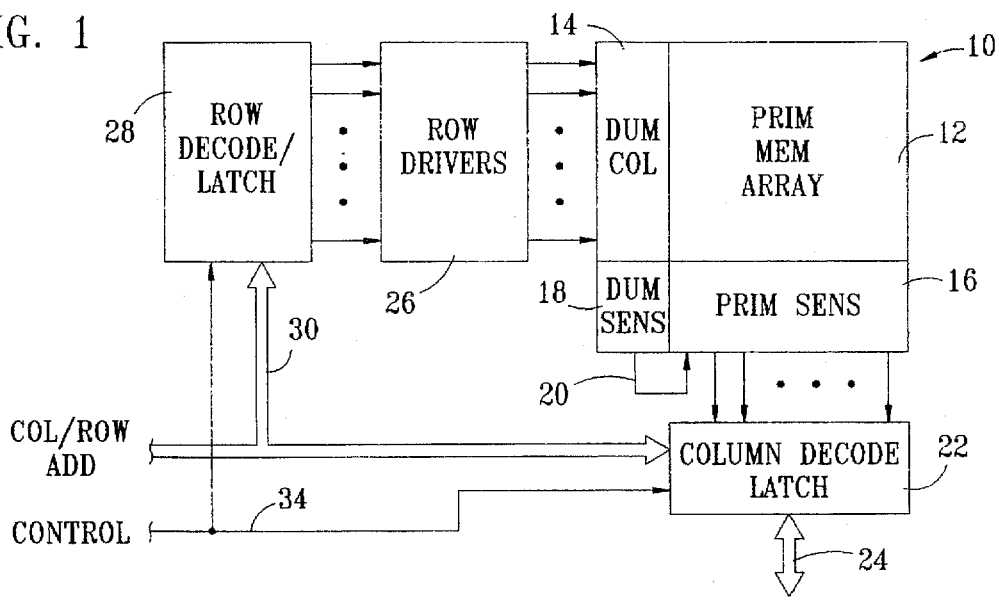
FIG. 1 illustrates a block diagram of a memory array incorporating the docked sense amplifier and enable control of the present invention.

Referring now to FIG. 1, there is illustrated a block diagram of a memory array utilizing the clocked sense amplifier with enable control of the present invention. A memory array 10 is provided which is comprised of a plurality of memory cells arranged in rows and columns, these being of the random access type. In this embodiment, these are static memory cells to provide a static random access memory (SRAM). The memory array 10 is comprised of a primary memory array 12 which is comprised of primary memory cells (not shown) arranged in rows and columns. Adjacent to the primary memory array 12 is disposed a column 14 of dummy cells. There is provided one dummy memory cell in the dummy column 14 for each row of memory cells in the primary memory array 12. Each column in the primary memory array 12 has associated therewith complementary bit lines (not shown) which are connected to a primary sense amplifier disposed in a block 16. The primary sense amplifiers in block 16 are each operable to sense the output of a given column, as will be described hereinbelow. The dummy column 14 has associated therewith a dummy sense amplifier 18. The dummy sense amplifier 18 provides an enable control on a line 20 to enable the primary sense amplifiers in the block 16. The primary sense amplifiers in the block 16 then provide an output to a column decode/latch circuit 22 which interfaces with an input/output (I/O) bus 24.

Each of the dummy memory cells in the dummy column 14 and each of the primary memory cells in the array 12 are controlled by Word Lines output by a row driver block 26, such that a given Word Line out of the row driver block 26 will activate all memory cells in a given row. The row driver receives the Word Lines from a row decode/latch circuit 28 which is operable to receive a row address on a bus 30 and decode this address to activate one of a plurality of Word Lines. The row decode/latch circuit 28 is controlled by a control signal on a control line 34, which control line also controls the column decode/latch circuit 22. The column decode/latch circuit 22 is also operable to receive a column address on the bus 30 to determine which of the column lines is to be output onto the I/O bus 24 for a Read operation, or to be retrieved from the column decode/latch circuit 24 for a Write operation. The multiplexed row and column address on the bus 30 are for a conventional multiplexed address system.

From a layout perspective, the dummy column 14 is disposed adjacent the array 12 and is comprised of the same number of rows as the array 12. This allows the dummy memory cells to share the same row lines, such that activation of a row line will select all primary memory cells in the array in that row and also the corresponding memory cell in the dummy column 14. However, it should be understood that the dummy column 14 could be located separate from the array 12 or embedded therein.

Figure 2:
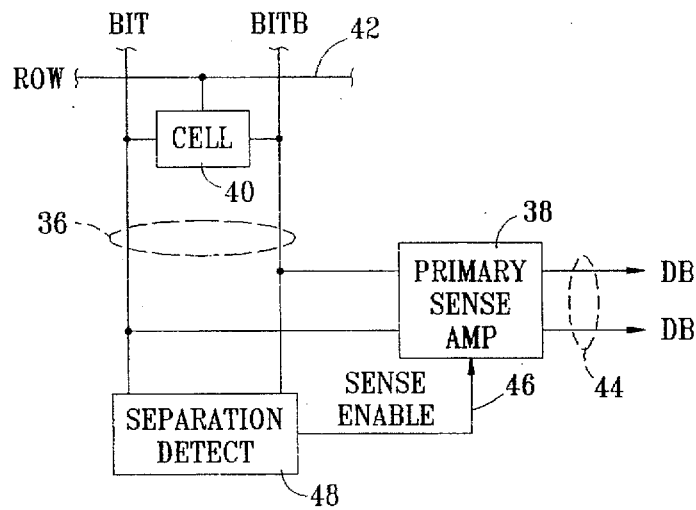
FIG. 2 illustrates a block diagram of the control system for the sense amp.

Referring now to FIG. 2, there is illustrated a block diagram depicting the enable operation for the primary sense amps. A pair of complementary bit lines 36 are provided for a single column, only a single column being illustrated for simplicity. The bit lines are comprised of a BIT line and a BITB line. The bit lines 36 are disposed on either side of a primary memory cell 40, which comprises the memory cells in the primary array 12. A Word Line 42 associated with the row in which the primary memory cell 40 resides is provided for activating the cell 40. When the cell is activated, the bit lines 36 will begin to separate, it being noted that in one configuration the bit lines are precharged to a predetermined level prior to activation of the memory cell 40 via the Word Line 42, this being a conventional operation.

The bit lines 36 are input to a primary sense amplifier 38, which primary sense amplifier 38 is disposed in the primary sense amplifier block 16. The primary sense amplifier 38 is operable to sense when the bit lines 36 have separated by a predetermined difference, this being a differential amplifier operation, and then driving a pair of output data lines 44 to the appropriate logic state, these being the D and DB lines. This provides a single bit of output information.

For illustration purposes, the primary sense amplifier 38 is controlled by a SENSE ENABLE signal on a line 46. The SENSE ENABLE signal on line 46 is generated by a separation detection circuit 48. The separation detection circuit 48 is operable to delay the activation of the primary sense amplifier 38 until the bit lines 36 have separated by a predetermined distance or voltage. Once this threshold has been exceeded, the SENSE ENABLE signal will be generated and the primary sense amplifier 38 "fired". Note that this is not a delay or timing operation but, rather, it is a detection operation which requires that the bit lines 36 be separated by a predetermined amount prior to the primary sense amplifier 38 being fired.

Figure 3:
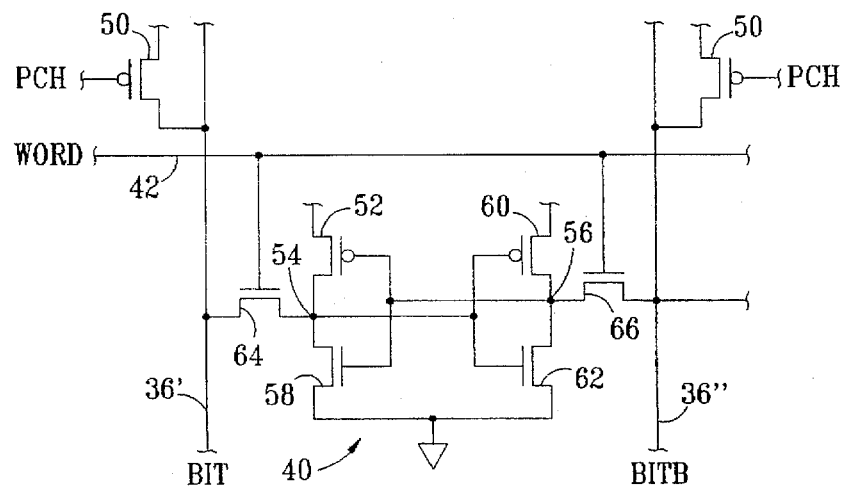
FIG. 3 illustrates a circuit diagram of a primary memory cell.

Referring now to FIG. 3, there is illustrated a circuit diagram of the memory cell 40. The bit lines 36 are referred to as the BIT Line 36' and the BITB Line 36". Each of the bit lines 36' and 36" has a precharged P-channel transistor 50 associated therewith that has one side of the source/drain thereof connected to the bit line, and the other side thereof connected to the $V_{CC}$, with the gate thereof connected to a precharged signal PCH. Although when activated, the transistors 50 pull the respective bit line 36' and 36" to the power supply rail, it should be understood that a different reference voltage could be utilized, such as $V_{CC}/2$.

The memory cell 40 is comprised of a cross-coupled CMOS latch. A first P-channel transistor 52 has the source/drain thereof connected between $V_{CC}$ and a data node 54, with the gate thereof connected to a data node 56, the data nodes 54 and 56 comprising the two complementary storage nodes in the memory cell 40. An N-channel transistor 58 has the source/drain thereof connected between the data node 54 and ground, with the gate thereof connected to the data node 56. A second P-channel transistor 60 has the source/drain path thereof connected between $V_{CC}$ and the data node 56 and the gate thereof connected to the data node 54. A second N-channel transistor 62 has the source/drain path thereof connected between the data node 56 and ground, and the gate thereof connected to the data node 54. A first N-channel access transistor 64 has the source/drain path thereof connected between the data node 54 and the bit line 36', with the gate thereof connected to the Word Line 42. A second N-channel access transistor 66 has the source/drain path thereof connected between the data node 56 and the bit line 36", the gate thereof connected to the Word Line 42.

In the initial operation, the Word Line 42 is held low and the precharged transistors 50 are activated by pulling the gates thereof low. This will pull the bit lines 36' and 36" to the positive rail. Since the bit lines 36' and 36" run the entire length of a column of memory cells, there is a significant amount of capacitance associated with these bit lines. Therefore, fast charging or discharging of this bit line would require a substantial driving transistor. By utilizing a precharge operation, both bit lines 36' and 36" can be pulled high over a long period of time, thus not requiring a very large precharge transistor and then, upon access, the low side of the memory cell can be pulled low.

During a Read operation, the precharged transistors 50 are turned off and then the Word Line 42 activated to turn on both transistors 64 and 66, such that data node 54 is then connected to bit line 36' and data node 56 is connected to bit line 36". If, for example, a logic "0" was stored on data node 54 and a logic "1" was stored on data node 56, then transistor 58 would be turned on and transistor 62 turned off. Thus, transistor 58 would then pull bit line 36' low, discharging the capacitance in the bit line. It can be appreciated that, if the bit line itself were utilized to drive an output device, the speed of the memory would then be defined as to how fast the transition could be made from a high voltage level to a low voltage level. Due to the capacitance of the bit line, this would require a relatively large transistor for the N-channel transistor 58. However, the sense amplifier is utilized to determine when the difference between the voltage level on the bit line 36' at the high voltage level due to the precharge operation, and the voltage level on the bit line 36' due to transistor 58 pulling it low separates by greater than approximately 500 mv. In this manner, the transistor 58 does not need to pull the bit line 36' all the way to ground, thus allowing a much smaller transistor to be utilized in the memory cell 40.

Figure 4:
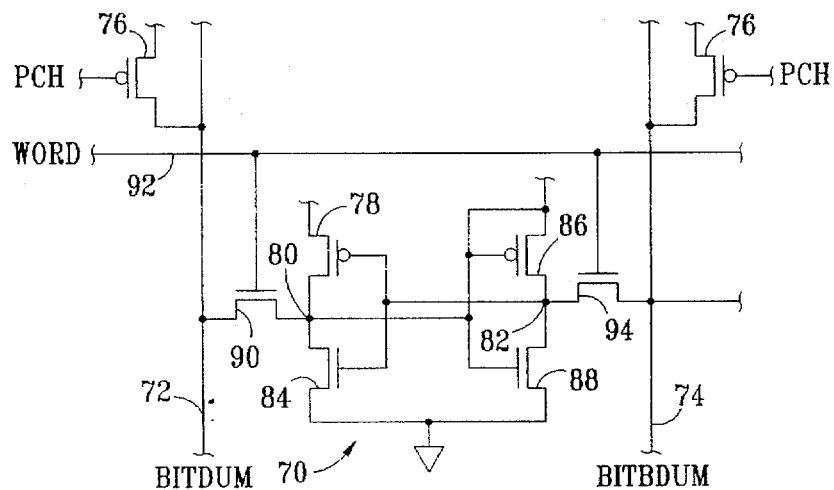
FIG. 4 illustrates a circuit diagram of a dummy memory cell.

Referring now to FIG. 4, there is illustrated a circuit diagram of a dummy memory cell 70. The dummy memory cell 70 is one of a plurality of dummy cells, one for each row of the primary array 12. The dummy cells in the dummy column 14 have associated therewith a pair of complementary bit lines, a bit line 72 and a bit line 74, bit line 72 labeled BITDUM and bit line 74 comprising the complementary bit line and labeled BITBDUM. Each of the bit lines 72 and 74 have associated therewith a P-channel precharge transistor 76 connected between $V_{CC}$ and the bit line, with the gate thereof connected to the precharge signal PCH. This allows the bit lines 72 and 74 to be charged high during the precharge operation. The memory cell 70 is comprised of a cross-coupled latch with a P-channel transistor 78 having the source/drain path thereof connected between $V_{CC}$ and a data node 80, the gate thereof connected to a data node 82, data nodes 80 and 82 being the complementary data nodes of the memory cell 70. An N-channel transistor 84 has the source/drain path thereof connected between data node 80 and ground, with the gate thereof connected to the data node 82. A second P-channel transistor 86 has the source/drain path thereof connected between $V_{CC}$ and data node 82, with the gate thereof connected to data node 80. A second N-channel transistor 88 has the source/drain path thereof connected between data node 82 and ground, with the gate thereof connected to data node 80. A first N-channel access transistor 90 has the source/drain path thereof connected between the bit line 72 and the data node 80, with the gate thereof connected to a Word Line 92. A second N-channel access transistor 94 has the source/drain path thereof connected between the data node 82 and the bit line 74, and the gate thereof connected to the Word Line 92. The transistors that make up the memory cell 70 are substantially identical in size to the transistors that make up the primary memory cell 40, for reasons that will be described hereinbelow. The dummy memory cell 70 is utilized in conjunction with the dummy sense amp 18 to generate an enable signal for the primary sense amp 38 and, therefore, it has a prestored value therein. This is facilitated by connecting the data node 80 to $V_{CC}$ and data node 82 to ground. Therefore, activation of the Word Line 92 will cause data node 82 to be connected to bit line 74, which will pull bit line 74 low, with bit line 72 remaining high. Additionally, the bit lines 72 and 74 are substantially identical to the bit lines 36' and 36".

Figure 5:
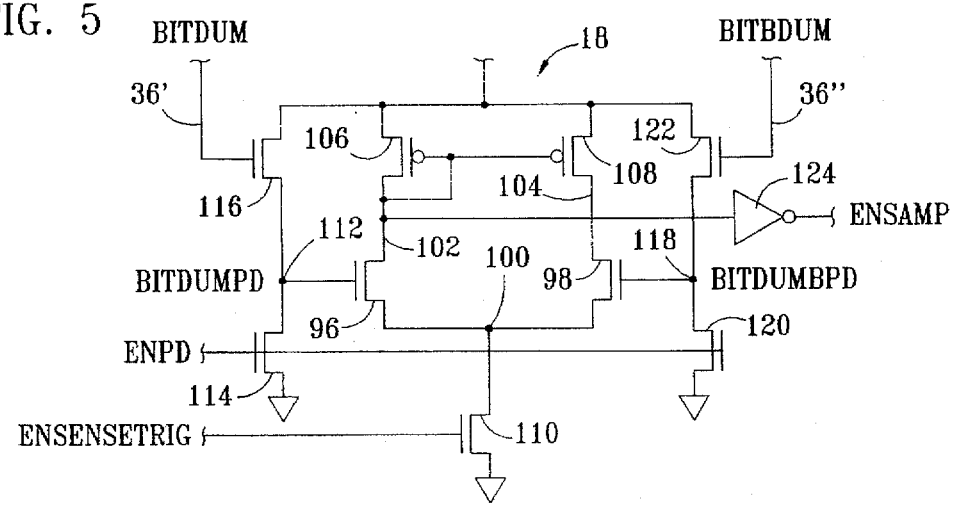
FIG. 5 illustrates a circuit diagram of the dummy cell sense amplifier.

Referring now to FIG. 5, there is illustrated a circuit diagram of the dummy sense amplifier 18. The dummy sense amplifier 18 is a differential amplifier utilizing a current mirror configuration. A differential pair of N-channel transistors 96 and 98 are configured in a common source configuration, with the sources thereof connected to a common node 100 and the drains thereof connected to nodes 102 and 104, respectively. Node 102 is connected to one side of the source/drain path of the P-channel transistor 106, the other side thereof connected to $V_{CC}$ and the gate thereof connected to node 102. The node 104 is connected to one side of the source/drain path thereof of a P-channel transistor 108, the other side thereof connected to $V_{CC}$ and the gate thereof connected to node 102 and the gate of P-channel transistor 106. The common source node 100 is connected to one side of the source/drain path of an N-channel enable transistor 110, and the other side thereof connected to ground, the gate of transistor 110 connected to an enable signal ENSENSETRIG. The gate of transistor 96 is connected to a node 112. Node 112 is connected to one side of the source/drain path of an N-channel transistor 114, the other side thereof connected to ground and the gate thereof connected to a signal ENPD. Node 112 is also connected to one side of the source/drain path of an N-channel transistor 116, the other side thereof connected to $V_{CC}$ and the gate thereof connected to the bit line 36'. The gate of transistor 98 is connected to a node 118, node 118 connected to one side of the source/drain path of an N-channel transistor 120, the other side thereof connected to ground and the gate thereof connected to the signal ENPD. Node 118 is also connected to one side of the source/drain path of a transistor 122, the other side thereof connected to $V_{CC}$ and the gate thereof connected to the bit line 36". The node 102 comprises the output of the differential sense amplifier that is input through an inverter 124 to provide on the output thereof the primary sense amplifier enable signal ENSAMP.

The transistors 116 and 114 and the transistors 122 and 120 are level shifters. This allows the high voltage level initially placed on bit lines 36' and 36" to be shifted down to an intermediate level for input to the gates of the differential input transistors 96 and 98. However, the transistors are sized such that there is an offset provided; that is, the voltage on the node 112 and the voltage on the node 118 are different for identical voltages on the gates of transistors 116 and 122. In this manner, the voltage on node 112 will be lower than the voltage on node 118 for the same voltages on the bit lines 36' and 36". Therefore, initially, the voltage on node 102 will be higher than the voltage on node 104 and the output of the inverter 124 will be low. When the voltage on bit line 36" falls below the voltage on bit line 36' by more than a predetermined amount, then the voltage on node 118 input to the gate of transistor 98 will fall below the voltage on node 112 input to the gate of transistor 96 and the voltage on node 102 will fall low, resulting in the output of inverter 124 going high. The differential offset is set greater than or equal to 500 mv, depending on the characteristics of the clocked latch sense amplifier.

Figure 6:
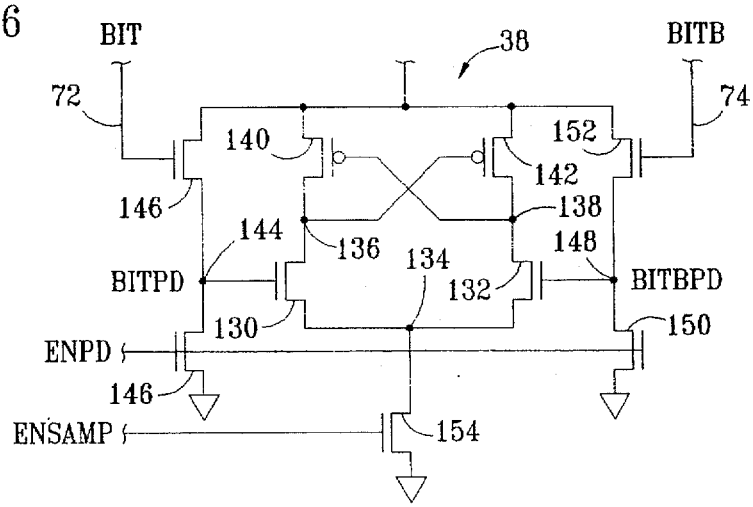
FIG. 6 illustrates a circuit diagram of the main sense amplifier with the enable control.

Referring now to FIG. 6, there is illustrated a circuit diagram of the primary sense amplifier 38 in block 1 6, which is a conventional clocked-latch type sense amplifier. This is a differential amplifier that is comprised of two differential N-channel channel transistors 130 and 132 having the sources thereof connected to a common source node 134, the drain of transistor 130 connected to a node 136 and the drain of transistor 132 connected to a node 138. Node 136 is connected to one side of the source/drain path of a P-channel transistor 140, the other side thereof connected to $V_{CC}$ and the gate thereof connected to the node 138. Node 138 is connected to one side of the source/drain path of a P-channel transistor 142, the other side thereof connected to $V_{CC}$ and the gate thereof connected to the node 136, with transistors 140 and 142 operating in a cross-coupled latch configuration. The gate of transistor 130 is connected to a node 144; node 144 is connected to the drain of an N-channel transistor 146, the source thereof connected to ground and the gate thereof connected to the ENPD signal. Node 144 is also connected to the source of an N-channel transistor 146, the drain thereof connected to $V_{CC}$ and the gate thereof connected to the bit line 72. The gate of transistor 132 is connected to a node 148, node 148 connected to the drain of an N-channel transistor 150, the source thereof connected to ground and the gate thereof connected to the ENPD signal. Node 148 is also connected to the source of an N-channel transistor 152, the drain thereof connected to $V_{CC}$ and the gate thereof connected to the bit line 74. Node 134 is connected to the drain of an N-channel transistor 154, the source thereof connected to ground, and the gate thereof connected to the ENSAMP signal that is output by the inverter 124 on the dummy sense amplifier 18.

The sense amplifier 38 operates in a conventional manner in that it will be enabled at a predetermined time and, during the enable operation wherein the transistor 154 is activated and node 134 is pulled low, the voltage on nodes 144 and 148 will determine the level of the voltage on nodes 136 and 138. As node 134 is pulled to ground, there will be an imbalance on the nodes 136 and 138 due to the voltages on the nodes 144 and 148, thus turning on one of the transistors 140 and 142. This will "latch" the data therein. Once latched, it must then be reset. Therefore, it is important that the imbalance (or separation) in the bit lines 72 and 74 be established prior to enabling this particular primary sense amp. As described above, prior systems would utilize some type of delay in enabling the sense amp to ensure separation of the bit lines prior to enabling. In the present invention, the bit lines must be separated by a predetermined value as determined by the offset in the dummy sense amplifier 18 before the enabling operation is initiated. Therefore, the enable operation is directly linked to the separation of the bit lines by the predetermined offset. This ensures that the primary sense amplifier 38 will not be enabled prior to adequate separation of the bit lines.

Figure 7:
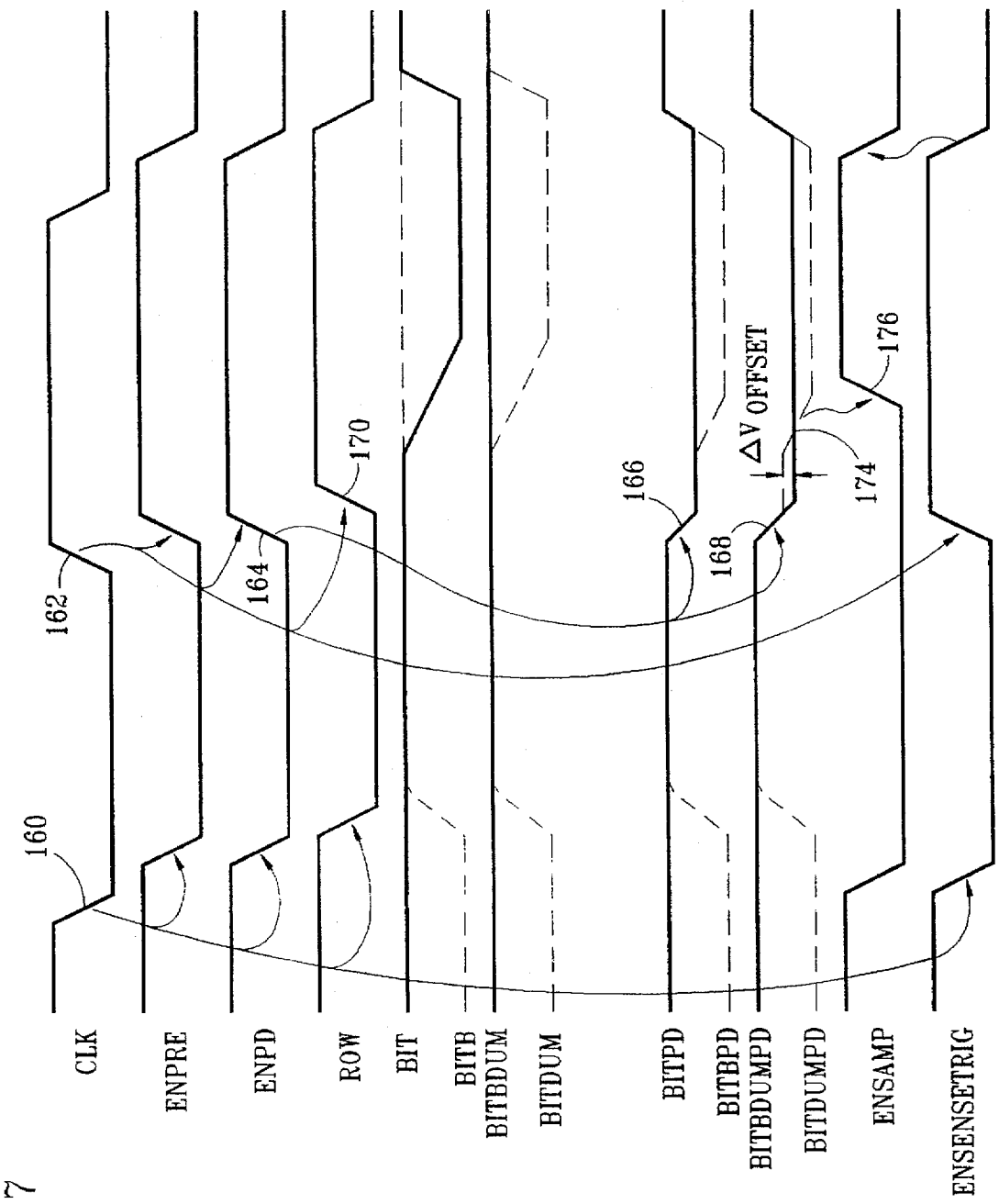
FIG. 7 illustrates a timing diagram for a Read operation.

Referring now to FIG. 7, there is illustrated a timing diagram depicting the operation of the memory. A clock signal CLK terminates a previous row access on the following edge thereof, an edge 160. This causes the ENPD signal to go low, the precharge enable signal ENPRE (corresponding to the PCH signal) to go low and the Word Line RON to go low, thus turning off access transistors 64 and 66 in the memory cell 40, and access transistors 90 and 94 in the dummy cell 70. Also, the enable signal ENSENSETRIG also goes low, turning off transistor 110 in the dummy sense amp 18. Once this is turned off, the signal ENSENSETRIG goes low, pulling the signal ENSAMP low. At this time, all of the bit lines are precharged high awaiting the next access cycle. This occurs upon the CLK signal going high at an edge 162. This causes ENPD to go high at an edge 164, which turns on transistors 114 and 120 in the dummy sense amp 18, and transistors 146 and 150 in the primary sense amp 38. As a result, the level shift operation in both sense amps will be enacted and the rail voltage will be pulled down on nodes 112 and 118 in the dummy sense amp 18, and 114 and 148 in the primary sense amp 38. This will result in the level of BITPD and BITBPD to be pulled down at an edge 166 and the level of BITBDUMPD and BITDUMPD to be pulled down at an edge 168. Additionally, the Word Line RON is turned on by the edge 162 going high, with a rising edge 170 activating the selected Word Line. Additionally, the ENSENSETRIG signal is also raised high by the rising edge 162 to turn on transistor 110. Note that the ENSAMP signal is still low and, therefore, the primary sense amp 38 is not activated.

Once the enable transistor 110 in the dummy sense amplifier 18 has been activated, the voltage on node 112 labeled BITDUMBPD will be pulled lower than the voltage on node 118 labeled BITDUMPD. This is due to the sizing of the transistors 114 and 116, and 120 and 122 to provide an offset greater than or equal to 500 mv. The Word Line RON is slightly delayed from this point to allow the level shifting to stabilize. Thereafter, the access transistors 64 and 66 in the primary memory cell 40 and the access transistors 90 and 94 in the dummy memory cell 70 are turned on by the edge 170. This will cause the primary bit lines to separate and the dummy bit lines to separate. The prestored value in the dummy memory cell 70 results in a logic "1" being stored on the BITDUM bit line side of the memory cell 70, such that BITDUMBPD will initially be higher than BITDUMPD and will then fall to a lower voltage. When the voltage on nodes 112 and 118 is equal at a point 174, then node 102 will be pulled low by transistor 96, resulting in the output of the inverter 124, ENSAMP, going high at an edge. An important aspect of the present invention is the fact that the dummy memory cell 70 and the primary memory cell 40 are substantially identical with respect to the configuration and size of the transistors. Further, since a dummy column includes the same number of memory cells as a primary column, the bit lines also are identical for the dummy column and each of the columns in the primary array. Since the capacitance of the dummy bit line and the capacitance of the primary bit line are identical, then the amount of time that is required for the primary bit lines to separate by a value of 500 mv will be the same time or substantially the same time as that required for the dummy bit lines to separate by 500 mv. This will be at approximately the time associated with the point 174. Therefore, when the signal ENSAMP is generated, the bit lines for the primary bit lines will have more than exceeded the 500 mv of threshold, thus ensuring that the primary sense amplifier 38 will not trigger on the false data. Another aspect that is important is the fact that the dummy column will scale with the primary array; that is, if the array increases in size, the length of a column will increase and, subsequently, the length of the dummy column will increase. Since they are identically configured, i.e., transistors in the primary array and transistors in the dummy column will be scaled down equally and the bit lines will also be scaled down equally between the dummy column and primary array, the point 174 at which the dummy bit lines separate by more than the offset associated with the dummy sense amp 18 will track the bit line separation for the primary memory cells.

In summary, there has been provided a method for controlling the operation of a clocked sense amplifier that is enabled during a Read access to a memory array. The enablement of the sense amplifier is delayed until after the bit lines associated with each column have separated by a predetermined threshold. Once this threshold has been exceeded, the sense amplifier is enabled and the difference therebetween sensed to latch the results in the sense amplifier.

Although the preferred embodiment has been described in detail, it should be understood that various changes, substitutions and alterations can be made therein without departing from the spirit and scope of the invention as defined by the appended claims.

What is claimed is:

1. A random access memory, comprising:

a primary array of primary memory cells arranged in rows and columns, with each said primary memory cells having true and complement data stored therein, and each column of said primary memory cells having a pair of precharged true and complement bit lines associated therewith, wherein access of one of said primary memory cells in a column will cause the voltage level of said associated pair of true and complement bit lines to separate relative to each other in accordance with the true and complement data stored in the accessed one of said primary memory cells;

at least one primary sense amp associatable with each pair of said true and complement bit lines for sensing the voltage level thereon and latching a data value when said true and complement bit lines have separated by a predetermined voltage difference, said at least one primary sense amp clocked by an enable signal such that said at least one primary sense amp will operate to sense when said enable signal is true;

a separation detector for determining the separation between said true and complement bit lines associated with said at least one primary sense amp; and an enable control for generating said enable signal when said detected bit line separation exceeds a predetermined threshold.

2. The random access memory of claim 1, wherein said separation detector comprises:

a column of dummy memory cells, each of said dummy memory cells having true and complement data stored therein, and said column of dummy memory cells having a pair of precharged true and complement bit lines associated therewith, wherein access to one said dummy memory cells in said dummy column will cause the voltage level of said associated pair of true and complement bit lines to separate in accordance with the true and complement data stored in the accessed one of said dummy memory cells; and a dummy sense amplifier for sensing the voltage difference between said true and complement bit lines in said dummy column and generating an output signal when the voltage separation thereof exceeds the predetermined threshold, said enable control then operable to generate said enable signal in response to generation of said output signal.

3. The random access memory of claim 2, wherein said dummy column contains the same number of memory cells as each of said columns in said primary array.

4. The random access memory of claim 3, wherein said bit lines in said dummy column are substantially the same size as said bit lines in said columns in said primary array.

5. The random access memory of claim 3, wherein each of said dummy cells is sized to substantially equal the size of each of said primary memory cells in said primary array.

6. The random access memory of claim 2, wherein each of said dummy memory cells has a predetermined logic state stored therein.

7. The random access memory of claim 6, wherein said dummy sense amplifier comprises a differential amplifier having an offset associated therewith.

8. The random access memory of claim 2, wherein said dummy column is disposed adjacent said primary array, and wherein said primary array has a plurality of row lines associated therewith, one for each of said rows of primary memory cells, each of said row lines being shared with one of said dummy memory cells.

9. The random access memory of claim 1, wherein each of said primary memory cells comprises a cross-coupled latch type memory cell.

10. A method for accessing data stored in a random access memory having a plurality of memory cells in an array arranged in rows and columns, with each of the memory cells having true and complement data stored therein, and each column of the primary memory cells having a pair of precharged true and complement bit lines associated therewith, wherein access of one of the primary memory cells in a column will cause the voltage level of the associated pair of true and complement bit lines to separate relative to each other in accordance with the true and complement data stored in the accessed one of the primary memory cells, comprising the steps of:

determining the separation between the true and complement bit lines for a select one of the pairs of true and complement bit lines;

generating an enable signal after the separation of true and complement bit lines separate in voltage level by a value equal to or exceeding a predetermined threshold;

sensing with a sense amp the separation on the select one of the pairs of true and complement bit lines in response to generation of the enable signal and storing data in a latch indicating whether the true bit line is higher or lower than the complement bit line.

11. The method of claim 10, wherein the step of sensing comprises:

disposing a dummy column of dummy memory cells adjacent to the array, each of the dummy memory cells being similar to the primary memory cells and the dummy column of dummy memory cells having a pair of true and complement bit lines associated therewith;

sensing the voltage across the true and complement bit lines associated with the dummy cells; and generating the enable signal when the voltage separation on the true and complement bit lines associated with the dummy column separate in voltage level by a value equal to or exceeding the predetermined threshold.

* * * * *